United States Patent
Richerzhagen

(10) Patent No.: US 7,163,875 B2
(45) Date of Patent: Jan. 16, 2007

(54) METHOD OF CUTTING AN OBJECT AND OF FURTHER PROCESSING THE CUT MATERIAL, AND CARRIER FOR HOLDING THE OBJECT AND THE CUT MATERIAL

(75) Inventor: Bernold Richerzhagen, Saint-Sulpice (CH)

(73) Assignee: Synova S.A., Ecublens (CH)

( * ) Notice: Subject to any disclaimer, the term of this patent is extended or adjusted under 35 U.S.C. 154(b) by 67 days.

(21) Appl. No.: 10/240,791

(22) PCT Filed: Apr. 4, 2001

(86) PCT No.: PCT/CH01/00218

§ 371 (c)(1),
(2), (4) Date: Jan. 27, 2003

(87) PCT Pub. No.: WO01/75966

PCT Pub. Date: Oct. 11, 2001

(65) Prior Publication Data

US 2004/0026382 A1 Feb. 12, 2004

(30) Foreign Application Priority Data

Apr. 4, 2000 (CH) .................................... 0666/00

(51) Int. Cl.
*H01L 21/46* (2006.01)
(52) U.S. Cl. ...................... 438/460; 438/463; 438/464; 257/E21.6
(58) Field of Classification Search ......... 438/460–464
See application file for complete search history.

(56) References Cited

U.S. PATENT DOCUMENTS

| | | | |
|---|---|---|---|
| 5,543,365 A | | 8/1996 | Wills et al. |
| 5,691,248 A | * | 11/1997 | Cronin et al. ................ 438/109 |
| 5,877,064 A | * | 3/1999 | Chang et al. ................ 438/401 |
| 6,407,360 B1 | * | 6/2002 | Choo et al. ............ 219/121.67 |
| 6,524,881 B1 | * | 2/2003 | Tandy et al. .................. 438/69 |

FOREIGN PATENT DOCUMENTS

| | | |
|---|---|---|
| JP | 61-121837 B2 | 6/1986 |
| JP | 63-036988 A | 2/1988 |
| JP | 07-074131 A | 3/1995 |
| JP | 07-283249 A | 10/1995 |
| JP | 2001-316648 A | 11/2001 |
| WO | 95/32834 A1 | 12/1995 |
| WO | 99/56907 A1 | 11/1999 |

* cited by examiner

*Primary Examiner*—H. Jey Tsai
(74) *Attorney, Agent, or Firm*—Birch, Stewart, Kolasch & Birch, LLP

(57) ABSTRACT

The invention relates to an object (1) that is cut by means of a laser and a water beam and to further processing of the cut material. The object is glued on a carrier (3) that is provided with an adhesive and can be transparent for the radiation used in the water beam (7). The carrier can be a solid body and preferably a fibrous mat (3). Said body or mat is penetrated by the water beam. The object (1) or the cut material thereof is held on the carrier (3) before, during and after cutting through in such a way that said object or material does not change position. In a preferred embodiment, a silicon wafer is used as the object because of the high cutting exactness to be obtained. Other materials can also be used.

7 Claims, 1 Drawing Sheet

Figure 1:
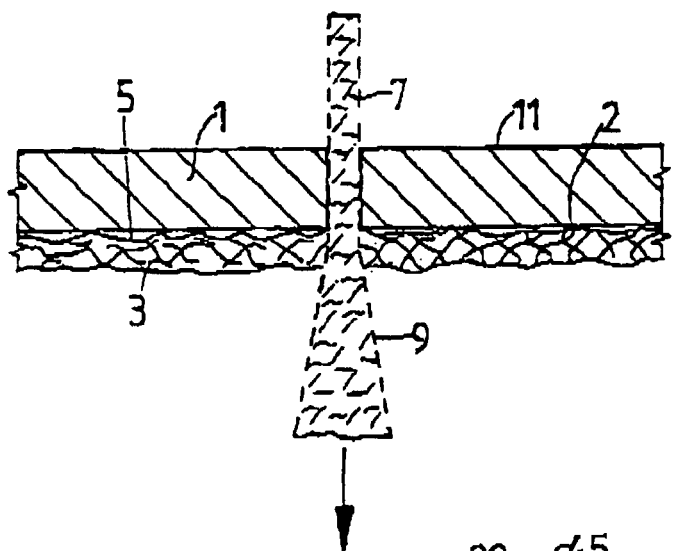

METHOD OF CUTTING AN OBJECT AND OF FURTHER PROCESSING THE CUT MATERIAL, AND CARRIER FOR HOLDING THE OBJECT AND THE CUT MATERIAL

This application is the national phase under 35 U.S.C. §371 of PCT International Application Ser. No. PCT/CH01/00218 which has an International filing date of Apr. 4, 2001, which designated the United States of America.

The invention relates to a method for the laser water-jet cutting of an object as claimed in patent claim 1 and a carrier which can be used in the method as claimed in patent claim 6.

PRIOR ART

On a silicon wafer there is a large number of chips ("dies") which, during and after the separation process, have had to be held in their original position as individual chips, in particular during further processing and treatment. For this purpose, before the separation of the chips, the silicon wafer has been bonded onto a carrier. The chips were then cut out with a saw. For the purpose of cutting out, the cutting depth of a diamond disk was set in such a way that the wafer was cut through completely but the carrier was cut only slightly. The known separating method needed exact setting of the cutting depth in the micron range. Furthermore, breakouts often occurred at the upper and lower edge of the chips. Cracks could also arise, which then led to fracture of the chip. The wear on the saw blade was high and, in addition, only straight cuts could be carried out.

OBJECT OF THE INVENTION

It is an object of the invention to provide a method and a carrier for an object to be processed (to be cut) with a laser water jet which permit the object to be held in the original position before, during and after a cutting operation, fixed in position even for subsequent processing treatments of the cut material (separated from one another by the cut). A further object of the invention, including the first object, is to process the object as a whole (preferably to thin it) and then to cut it without renewed fixing; in addition, one or more wafers should be capable of being separated satisfactorily and their cut material (chips; dies) should likewise be capable of being fixed securely in their original position for subsequent treatment.

ACHIEVING THE OBJECT

The first object is achieved by the object being fixed on a carrier with an adhesive, by means of which fixing for subsequent further processing or processing after the separation of the cut material is also maintained. For the purpose of separation, according to the invention a laser water jet is used.

The carrier can then be transparent or non-transparent to the laser radiation. If a non-transparent carrier is used, then this is attacked by the laser radiation. However, the laser intensity will be selected in such a way that there is only a slight removal of material from the carrier. A small cut groove will then result in the cut. However, this cut groove prevents water passing between the carrier and the cut material.

Silicon plates have in particular been tried and tested as non-transparent material, since these can be obtained in good flat quality at favorable prices.

If a carrier of material transparent to the laser radiation is selected, it is not attacked by the laser radiation, that is to say not removed and not cut through. If a wafer is used as the object, then the chips (dies; cut material) produced by separation remain fixed in position for further processing. If, in addition, a material that is permeable to a liquid, in particular water, is used in the carrier, then the liquid here does not penetrate under the cut but still bonded material either.

Instead of only cutting the adhesively bonded object, it can also be processed as a whole before cutting, but then already being adhesively bonded to the carrier. If the invention is applied to the production of chips on wafers, then the entire wafer can be ground thin before cutting. Following grinding, the thin wafer is then cut up by the laser water jet in accordance with the desired contours into a large number of chips which, even after the cut, are fixed in position on the carrier because of their bonding. Alignment of the cuts to be carried out can be provided by means of diverse methods. Position marks can be produced by drillings or incisions produced in advance. However, the position of the cuts can also be determined by image recognition measures. If the chips are semiconductor or optical chips, then these wafers, that is to say the uncut wafers whose thickness has not yet been reduced, will be adhesively bonded to the active surface and the rear side will then be machined. Cutting will also take place from the rear. In this case, position detection is then possible via an infrared camera, if the material of the carrier (e.g. silicon) is transparent in this wavelength range.

If a mat, in particular a flexible, preferably extensible mat (tissue), is preferably used as the carrier, then by means of expansion, the spacing of the chips from one another can be enlarged in such a way that their mutual contact during removal from the carrier becomes impossible.

The mat can then be composed of a woven or a non-woven fiber material. The non-woven fiber material is significantly cheaper than the woven, but its density is inhomogeneous, in particular in relation to penetration of the water from the laser water jet.

In addition to the optical property of transparency to the laser radiation used, apart from water permeability, the remaining mechanical properties are of subordinate significance. Typically, use will be made of fibers with a fiber diameter of about 5 μm to 100 μm, preferably of 5 μ to 50 μm, and a fiber spacing of 0 to 500 μm, in particular of 0 to 150 μm, preferably of 0 to 50 μm.

The water from the water jet forces the fibers slightly to the side in order to pass through the mat. The adhesive located at the point of impingement of the laser water jet after passing through the object to be separated will be washed out to a greater or lesser extent, depending on the material used. However, depending on the method used, the chip will remain adhering to the mat by its underside or upper side (active side).

However, an adhesive can also be selected which is not washed out at all or washed out only slightly. This is because the water jet, as indicated above, forces the fibers of the mat apart. The water can therefore penetrate through the mat, even when the adhesive wholly or partly remains. If the adhesive is not washed out or only slightly washed out, the passage path (cut extension) along the laser water jet cut is able to "bond" again, depending on the adhesive used. If the mat with the separated chips is to be held by a vacuum holder, as it is known, while an individual chip is pressed upward by pinning, then the rebonded "passage lines" assist the suction force of the vacuum holder by means of adequate "air tightness". However, the rebonding is of subordinate importance, since the passage paths, with their low area in relation to the remaining area, on which the suction holder acts, are virtually insignificant.

Since the mat is flexible, the chips can be thrown out by means of pins sticking through the mat or pressing against the rear of the mat and can be gripped by a vacuum gripper (pick and place).

Instead of a flexible mat, a transparent plate can also be used as the carrier. The laser beam then passes through the plate without processing it. The water leaves the cut gap in its cutting direction. This method is particularly suitable for very thin, that is to say fragile chips or wafers. Identification of the chips by means of laser radiation (laser marking) on the rear of said chips can also be performed through the transparent plate. Since the carrier plate is not attacked, it can be used again and again. As a result of this laser marking, tracking of the individual chips during the subsequent processing is possible.

However, if a porous plate (e.g. a sintered or photochemically treated glass plate) is used instead of a compact plate, as described below, then the water can also flow away through this plate.

In summary, it can be stated that, as the carrier for material to be cut, depending on the particular application, a "mat" can be used which
- is transparent to the cutting laser radiation of the laser water jet,
- is water permeable,
- is extensible or else non-extensible,
- is woven or else non-woven and can consist of
  - polyethylene,
  - polypropylene,
  - PET or
  - polyurethane, . . .

However, matched to the application, a solid carrier can also be used, which
- is non-extensible,
- is transparent or non-transparent,
- is not water permeable or is water permeable and consists of
  - glass,
  - quartz or
  - silicon, . . .

Adhesion between the material to be cut (e.g. wafers) and the carrier is carried out by means of
- a UV adhesive,
- vacuum,
- a thermal adhesive,
- wax, . . .

Depending on the chosen application, the material to be cut can then be adhesively bonded to the carrier by its active side (possibility of "thinning" already on the carrier) or passive side.

EXEMPLARY EMBODIMENTS OF THE INVENTION

Figure 3:
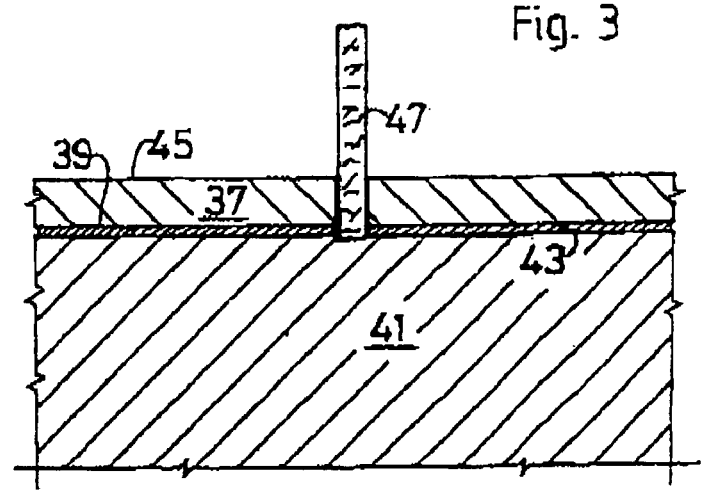
Figure 2:
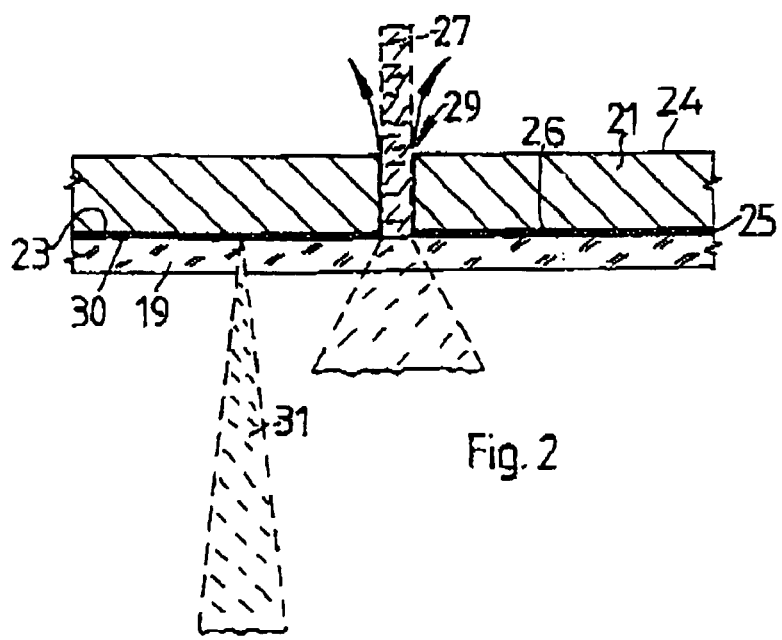

In the following text, examples of the carrier according to the invention and of the laser water-jet cutting according to the invention will be explained in more detail using several examples and with reference to the drawings, in which:

FIG. 1 shows a cross section through a mat-like carrier with an object adhesively bonded on, FIG. 2 shows, analogous to this, a cross section with a plate-like solid carrier and FIG. 3 shows a variant of the method illustrated in FIGS. 1 and 2.

WAYS OF IMPLEMENTING THE INVENTION

FIG. 1 illustrates a silicon wafer 1 with its underside 2 adhesively bonded to a mat 3, in cross section. The "active" upper side 11 of the wafer 1 is free at the top. The mat 3 consists of fiber material covered or impregnated with adhesive. Since this is a fiber material, the surface 5 of the mat 3 is illustrated as irregular. However, it should be noted that this is a great exaggeration. This is because a laser water jet 7 cutting through the wafer 1 typically has a diameter of only 50 µm. After passing through the mat 3, the water jet 7 forcing the fiber material of the mat 3 to the side, the water jet is widened considerably 9, that is to say sprayed away.

The production of a laser water jet to be used for this purpose is described, for example, in EP-A 0 762 947 and WO 99/56907.

The mat 3 can be composed of woven or non-woven fiber material (tissue). The fibers of the fabric are typically 20 µm thick. However, they can also be chosen to be thicker or else thinner. It is important merely that the fiber material does not exhibit any noticeable absorption to the laser radiation, in order that no removal of material and therefore no destruction of the mat 3 by the laser radiation occurs. The fiber material should also have a certain heat resistance, in order that it is not damaged by the melt of the wafer material emerging from the separating cut. The fiber material used, if operations are carried out with the radiation from a neodymium laser at 1.06 µm wavelength, can be, for example, polyurethane, polypropylene, . . . In addition, the fiber material should not be too dense, in order to achieve porosity during the penetration of the water jet. Because of the porosity, the mat is extensible, so that after the wafer 3 has been cut through, the spacing of the chips can be increased by expanding the mat. This ensures that the chips do not touch one another during subsequent removal. The mat 3 has a thickness in the range from 10 µm to 500 µm, preferably from 10 µm to 100 µm, that is to say it could also be referred to as a "porous" film.

The mat 3 is preferably held laterally under a predefined tension. However, in order to prevent sagging, the mat can also be supported by supports placed underneath. The supports can be extremely thin, for example designed as tensioned wires. Preferably, however, the support or supports will be transparent, in order to avoid removal of material by the laser radiation passing through the mat. Struts porous to water have proven to be particularly advantageous. The strut then picks up the water and does not throw it back, as a result of which the wafer remains flat. Open-pore glass or glass foam can be used as strut material. In addition, ceramic or ceramic foam can be employed. In addition, good results have been achieved with sintered glass spheres and photostructured glass.

The adhesive used is preferably an acrylic, UV, thermoplastic adhesive, and so on.

In order to separate chips from a wafer 1, the latter is placed on the workplace equipped with a mat 3. The wafer 1 can be pressed on lightly or attracted by vacuum. It is then immovably held on the mat 3 provided with an adhesive. The laser water jet 7 is then moved over the wafer surface 7 in accordance with the position of the chips to be separated out. The wafer 1 is cut through, the water jet serving firstly to guide the laser beam and simultaneously cooling the cut edges. Following passage through the wafer 1, the water jet then "forces" through the fiber material and sprays out.

Depending on the adhesive used, the latter is flushed out to a greater or lesser extent by the water jet. If chips are subsequently to be removed by a vacuum gripper, then the mat is held by a vacuum holder after cutting and only at the location of the chip to be removed is the latter lifted by pins in the vacuum holder, which pins act on the rear of the mat. The vacuum holder operates as a hold-down, as it is known.

As already indicated at the beginning, an adhesive can be used which subsequently, migrating into the cut again, bonds the latter adhesively in an "airtight" manner. By this means, the suction performance of the vacuum holder is somewhat improved. However, the improvement is insignificant, since the cut produced by the laser water jet is very narrow, of the order of 50 µm. This means that, when viewed over the entire area, the cuts make up only about 2% to 5%.

Instead of a more or less flexible mat 3, however, a solid-body plate 19 transparent to the laser radiation can also be used as a carrier, as illustrated in FIG. 2. If the radiation from a neodymium laser (1.06 µm) is used, quartz, for example, can be used as the plate material. The plate 19 is preferably given a microstructure on its surface adjacent to the wafer 21 to be placed on it and subsequently to be cut through, on which microstructure the adhesive 25 is then applied in a manner analogous to that already mentioned above, so that the adhesive always holds on the plate well but does not transfer to the underside of the chips, but only has an adhesive holding action in relation to the latter. Here, too, the wafer is adhesively bonded on by its underside 26 (non-"active" surface). Its "active" upper side 24 is free.

During laser water-jet cutting, the jet 27 now cuts through the wafer 21. The laser beam transmits the plate 19 without removing the latter. The water from the laser water jet 27 goes away in the direction of the cut 29 in the case of the compact plate 19. The cut 29 has a typical width of about 50 µm and less.

As a solid carrier, the plate 19 cannot be expanded. During the removal process of the chips, it is then necessary to operate exactly in such a way that the chips do not touch. Since, here, there exists very high positional accuracy, even following the separation, the chips can additionally be tested still adhesively bonded to the carrier.

By using a further laser beam 31 focused onto the rear side 30 of the chip, marking (labeling) of the chips can be performed. This marking permits identification of the chip during the entire processing operation. The carrier plate, which is also transparent to the labeling radiation, does not have to be plane-parallel, since a long focal length is generally used for the labeling radiation.

The use of a transparent solid body as a carrier is indicated wherever fragile, thin wafers are concerned.

The plate 19 can then be a compact transparent plate, such as is produced from a melt, for example. However, it can also be a sintered, in particular porous plate. A porous plate additionally has the advantage that the water from the laser water jet can flow away through it. The plate can therefore consist of open-pore glass or glass foam, of ceramic or ceramic foam, of sintered glass spheres, of photostructured glass, . . .

In the laser water jet, the laser beam carrying the energy necessary for the separating cut is guided in a water jet. Instead of water, however, another liquid transparent to the laser radiation can also be used. However, water has been tried and tested, since it is inexpensive and has a high thermal capacity.

Instead of a silicon wafer, other objects can also be held by the carriers described above for the purpose of laser water-jet cutting. For example, wafers of germanium, GaAs, silicon carbide and so on in plate form can be processed. Instead of a plate form, other small parts of variable size can also be held and processed.

If, for example, an adhesive with a variable adhesive force is used, then the adhesive force can be reduced in order to be gripped by the vacuum gripper. An adhesive of this type is, for example, a UV adhesive, as it is known. As a result of irradiation with UV radiation, its adhesive force is reduced. Irradiation would then be carried out at the time at which a chip is gripped by the vacuum gripper, in order to reduce the holding force.

The processing of thin wafers (thinner than 300 µm, preferably thinner than 100 µm) requires great care in chip production. The handling, particularly of the thin wafers, is difficult. This is because these wafers bend "like paper" and sag. They fracture easily during handling. In this case, they can also be subjected to mechanical stress, which can lead to subsequent fracture of the chips cut out of the wafer. The previously used sawing with diamond disks as opposed to the method according to the invention, as explained above and below in a further variant, additionally often allowed edge fractures and cracks to arise.

As is known, the still "thick" wafers, with a thickness of 700 µm, for example, after the chip structures had finally been processed, were bonded by the active side on a "grinding tape", as it is known, and were then ground thin starting from the wafer rear side. In this case, processing was carried out mechanically, wet chemically or dry chemically. Following grinding, the "grinding tape" was removed and the now thin wafer was adhesively bonded to a new "dicing tape", as it is known, by its just ground surface. The active side of the chips was now at the top. Great care had to be taken here in order to rule out fracture of the thin wafer.

The individual chips were then cut out of the wafer, for example with a diamond saw, as already described above in the introduction. As a result of conventional sawing, microcracks starting from the cut edges could expand into the chip, which made this chip unusable.

Following sawing, the chips, which still adhered to the "dicing tape", were taken off individually and further processed in a "die bonder", as it is known.

As a variant of the invention, the procedure can now be as follows and illustrated in FIG. 3:

The still thick wafer 37 with a thickness of 700 µm, for example, after the chip structures have finally been processed, is then adhesively bonded by the active side 39 to a carrier 41 and ground thin as known. The carriers used can be the materials already described above; however, use can also be made, for example, of a silicon wafer as the carrier 41. The adhesive 43 used can be the adhesives mentioned above; however, wax, for example, can also be used.

After the wafer 37 has been ground thin (illustrated in FIG. 3), the chips are cut from the rear side 45 of the wafer 37 with a laser beam and laser water jet 47. Rebonding, as in the conventional method, has therefore been omitted, and therefore also the great risk of fracture of the thin wafer 37.

However, the upper side of the wafer or chip is now covered by the carrier 41 and therefore also protected by the latter. Alignment of the cutting paths to be followed in relation to the chips is now performed as follows: the wafer 37 is viewed from the rear side by an infrared camera. This is because the silicon wafer is transparent in the infrared spectral range (and the wafer is also now very thin). Furthermore, in the case of non-transparent material, for the purpose of alignment, through-holes can be made before thinning. By using the holes, which are located at the edge of the wafer, for example, exactly on the center line of a cutting path, the cutting pattern can also be determined from the rear side. The wafer can also have small "notches", as they are known, (small semicircular bulges) at the edge of the wafer. The position of the cutting paths to be followed relative to these notches can be determined exactly before "thinning".

Following the cutting of the chips, the adhesive force of the adhesive is preferably reduced. A reduction in the adhesive force can be carried out, for example, by heating the wax; the adhesive force of other adhesives can be changed (reduced) for example by means of irradiation (UV irradiation). The entire wafer with its cut chips is then removed as a whole from the carrier by means of a vacuum table. The active side of the chips is then free and can be cleaned of adhesive residues. The chips are then taken individually off the vacuum table and further processed in the "die bonder".

The advantage of this processing method is, firstly, the eliminated rebonding. The wafer remains on the stable carrier following "thinning" and during the cutting of the chips. There is no longer any risk of fracture.

It is to be seen as a further advantage that the active side of the chips is protected during cutting. In addition, no more additional tapes are now needed. One bonding operation has also been omitted (only one instead of two).

The invention claimed is:

1. A method of cutting through a wafer with laser radiation, which is moved over the contours to be cut out from the wafer in accordance with said contours,
    the wafer preferably being constructed as a silicon wafer and being fixed onto a carrier having an adhesive, wherein
    the laser beam is guided in only a single water jet and cuts completely through the wafer,
    the carrier being a mat of woven fiber material penetratable by said water of said water jet but not cut through,
    in order that the cut wafer (chips) still adhering to the carrier and separated from one another by cuts is still available in the original position for preferably immediately following processing treatments.

2. The method as claimed in claim 1, wherein said carrier is a flexible mat, where because of extension, the spacing of the cut wafer from one another being enlarged such that there is no mutual contact during removal from the carrier.

3. The method as claimed in claim 1, wherein said carrier is an extensible mat containing fibers and the water of the water jet forces the fibers slightly to the side in order to pass through the mat.

4. The method as claimed in claim 1, wherein fibers of said woven fiber material are transparent to the radiation of the laser beam being used.

5. The method as claimed in claim 1, wherein after adhesively bonding the wafer to the carrier the wafer is ground down to a predefined thickness, and
    then the cut wafer, remaining stuck to the carrier, is cut out, the wafer being a wafer with a plurality of chips, whose active layer is adhesively bonded to the carrier.

6. The method as claimed in claim 1, wherein the underside of the cut wafer is marked by a labeling laser.

7. The method as claimed in claim 1, wherein the carrier is held by a vacuum holder for further cut wafer processing.

* * * * *